United States Patent
Bombardier et al.

(10) Patent No.: US 6,503,827 B1
(45) Date of Patent: Jan. 7, 2003

(54) METHOD OF REDUCING PLANARIZATION DEFECTS

(75) Inventors: Susan G. Bombardier, Essex, VT (US); Paul M. Feeney, Aurora, IL (US); Robert M. Geffken, Burlington, VT (US); David V. Horak, Essex Junction, VT (US); Matthew J. Rutten, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/605,806

(22) Filed: Jun. 28, 2000

(51) Int. Cl.[7] .......................................... H01L 21/4763
(52) U.S. Cl. ....................... 438/631; 438/633; 438/634; 438/687; 438/637; 438/672
(58) Field of Search ........................... 438/634, 637–640, 438/687, 672, 675, 633, 618, 624

(56) References Cited

U.S. PATENT DOCUMENTS

| | | | |
|---|---|---|---|
| 4,541,168 A | | 9/1985 | Galie et al. |
| 4,758,306 A | | 7/1988 | Cronin et al. |
| 4,936,950 A | * | 6/1990 | Doan et al. ................. 156/643 |
| 4,997,746 A | | 3/1991 | Greco et al. |
| 5,008,216 A | | 4/1991 | Huang et al. |
| 5,286,675 A | * | 2/1994 | Chen et al. |
| 5,625,232 A | | 4/1997 | Numata et al. |
| 5,783,490 A | * | 7/1998 | Tseng ........................ 438/692 |
| 5,798,299 A | * | 8/1998 | Chung ....................... 438/625 |
| 5,801,093 A | * | 9/1998 | Lin ............................ 438/624 |
| 5,817,574 A | * | 10/1998 | Gardner ...................... 438/637 |
| 5,910,020 A | * | 6/1999 | Yamada ....................... 438/624 |
| 5,932,907 A | | 8/1999 | Grill et al. |
| 6,037,216 A | * | 3/2000 | Liu et al. .................... 438/253 |
| 6,090,699 A | * | 7/2000 | Aoyama et al. ............. 438/622 |
| 6,103,455 A | * | 8/2000 | Huang et al. ............... 438/618 |
| 6,103,569 A | * | 8/2000 | Teo et al. .................... 438/253 |
| 6,150,272 A | * | 11/2000 | Liu et al. .................... 438/692 |
| 6,159,845 A | * | 12/2000 | Yew et al. .................... 438/637 |
| 6,159,846 A | * | 12/2000 | Yew et al. .................... 438/637 |
| 6,165,895 A | * | 12/2000 | Lin ............................ 438/633 |
| 6,168,989 B1 | * | 1/2001 | Chiang et al. ............... 438/253 |

OTHER PUBLICATIONS

Planarization Process Using Spin–On–Glass and Polishing, Research Disclosure, Jun. 1991, No. 326, Kenneth Mason Publications Ltd, England, 1 page.

Producing Integral Via and Pad Metallurgy, A. P. David and A. M. Flannery, IBM Technical Disclosure Bulletin, vol. 14, No. 1, Jun. 1971, p. 101.

* cited by examiner

Primary Examiner—Chandra Chaudhan
Assistant Examiner—Thanh Nguyen
(74) Attorney, Agent, or Firm—Schmeiser, Olsen & Watts; Howard J. Walter, Jr.

(57) ABSTRACT

A method of reducing the planarization defects produced during the manufacture of semiconductor devices. A sacrificial layer, having defects produced during a interconnection feature planarization step, is removed prior to the formation of subsequent layers to reduce the replication of unwanted defects.

24 Claims, 7 Drawing Sheets

METHOD OF REDUCING PLANARIZATION DEFECTS

BACKGROUND OF THE INVENTION

1. Technical Field

The present invention relates generally to the semiconductor industry, and more particularly, to the formation of a semiconductor device having reduced planarization defects.

2. Related Art

Planarization processes, such as chemical mechanical polishing (CMP), are often utilized at various stages of semiconductor manufacturing. Unfortunately, these commonly used planarization processes often produce yield detractors or defects, such as scratches, trenches formed by dishing or erosion that create puddles of conductive material, and so on. Often these defects reproduce in subsequent layers of a semiconductor device, resulting in potential shorts, reduced production yields, etc.

Accordingly, there exists a need in the industry for a method of reducing the defects produced during planarization processes.

SUMMARY OF THE INVENTION

A first general aspect of the present invention provides a method of forming a semiconductor device, comprising: (a) providing a substrate; (b) depositing a sacrificial layer over a surface of the substrate; (c) forming an at least one interconnection feature within the substrate and the sacrificial layer; (d) depositing a liner within the interconnection feature; (e) depositing a conductive material over the surface of the substrate; (f) planarizing the substrate; and (g) removing the sacrificial layer.

A second general aspect of the present invention provides a method of forming a semiconductor device, comprising: providing a substrate having a first sacrificial layer formed on the substrate; forming at least one first interconnection feature within the substrate and the first sacrificial layer; depositing a first liner within the at least one first interconnection feature; depositing a first conductive material over a surface of the substrate; planarizing the substrate; and removing the first sacrificial layer.

A third general aspect of the present invention provides a method of reducing the formation of defects during semiconductor manufacture, comprising: (a) providing a substrate; (b) depositing a sacrificial layer on the substrate; (c) forming at least one interconnection feature within the sacrificial layer; (d) depositing a conductive material over a surface of the substrate; (e) planarizing the surface of the substrate; and (f) removing the sacrificial layer having defects produced therein from the planarizing.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
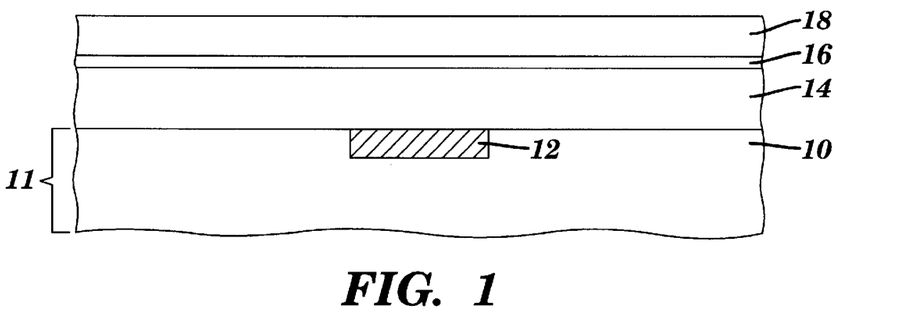
FIG. 1 depicts a semiconductor substrate in accordance with a first embodiment of the present invention.

Referring to the drawings, FIG. 1 shows a semiconductor wafer or semiconductor substrate 10 having a first metal layer 12 formed therein. The metal layer 12 is referred to as the "first layer" for purposes of illustration only, and is not intended to limit the present invention in any manner. The substrate 10 comprises silicon, or other similar materials used in the manufacture of semiconductor devices. The first metal layer 12, is a metal line in this example, but may be a via, dual damascene feature, etc. The first metal layer 12 comprises copper, aluminum, tungsten, etc., or any other materials typically used in the formation of semiconductor devices. The first metal layer 12 represents a connection that may be formed in a first level of wiring 11.

An inter-metal-dielectric (IMD) or inter-level-dielectric (ILD) layer 14 is deposited over the surface of the substrate 10 and the first metal layer 12. The ILD layer 14 provides an insulating layer between the first wiring level 11 and the second wiring level being formed. The ILD layer 24 comprises oxides or various low k materials, such as fluorosilciate glass (FSG) and SiCOH, deposited using CVD (chemical vapor deposition) or PECVD (plasma enhanced chemical vapor deposition), and various polymers, such as polyarelene ethers (PAE) or aerogels, deposited by spin on techniques. Other similar materials and/or deposition techniques may also be used. The thickness of the ILD layer 14 ranges between approximately 500 Å–2 microns.

An etch stop layer 16 is deposited over the ILD layer 14 using PECVD techniques. In the alternative, other conventional processes may be used to deposit the etch stop layer 16. The etch stop layer 16 comprises silicon nitride, however, other materials that are capable of withstanding the subsequent selective etch step may also be used. The selectivity of the material used for the etch stop layer 16 is dependent upon the dielectric used in the ILD layer 14 and the etch chemistry chosen to form the interconnect structures (infra). The etch stop layer 16 is deposited at a thickness in the range of about 100–1000 Å.

A sacrificial layer 18 is deposited over the etch stop layer 16. The sacrificial layer 18 comprises oxides or various low k materials, such as fluorosilciate glass (FSG) and SiCOH, deposited using CVD or PECVD, and various polymers, such as polyarelene ethers (PAE) or aerogels, deposited by spin on techniques. Other similar materials and/or deposition techniques may also be used. The sacrificial layer 18 has a thickness in the range of approximately 1000–3000 Å.

Figure 2:
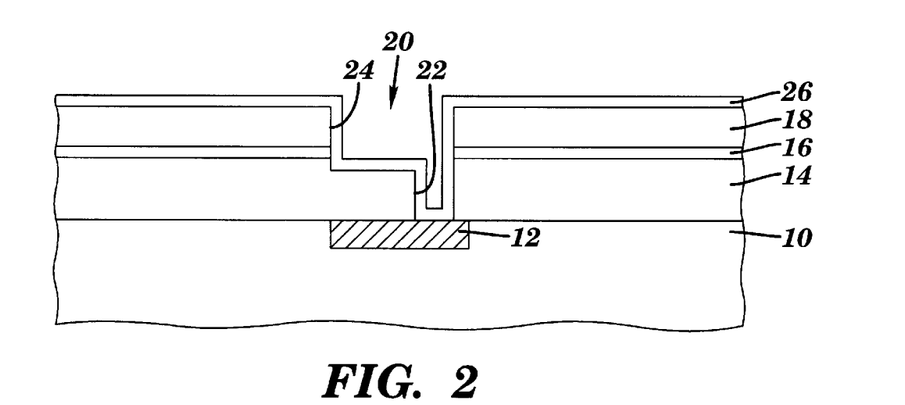
FIG. 2 depicts the semiconductor substrate of FIG. 1 having a interconnection feature formed therein in accordance with a first embodiment of the present invention.

As illustrated in FIG. 2, at least one interconnection feature 20 is then formed within the ILD layer 14, the etch stop layer 16 and the sacrificial layer 18, stopping at the first metal layer 12. In this example, the interconnection feature 20 is a dual damascene interconnection feature, composed of a via 22 and a wire or trench 24, formed using conventional dual damascene processes. The scope of the present invention, however, is in no way intended to be limited to use in conjunction with dual damascene structures. Rather, the present invention may be used in connection with any damascene structure. Furthermore, only one interconnection feature 20 is shown merely to simplify the explanation, and is not intended to limit the scope of the present invention.

A diffusion barrier or liner 26, which prevents the conductive material (described infra) within the interconnection feature 20 from migrating into the surrounding regions of the device, is deposited over the surface of the substrate 10. The liner 26 comprises tantalum and/or tantalum nitride, having a thickness in the range of approximately tens of nanometers. Other materials providing a similar function may also be used, such as titanium, titanium nitride, tungsten, tungsten nitride, etc. The liner 26 is deposited using physical vapor deposition (PVD) techniques, however, other similar deposition techniques, e.g., chemical vapor deposition (CVD), plating, etc., may also be used.

Figure 3:
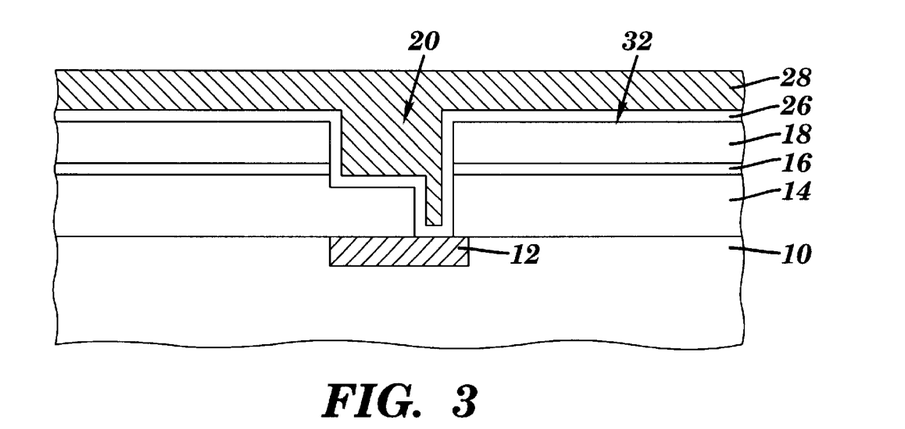
FIG. 3 depicts the semiconductor substrate of FIG. 2 having a conductive material thereover in accordance with a first embodiment of the present invention.

As illustrated in FIG. 3, a conductive material 28 is deposited over the surface of the substrate 10, filling the interconnection feature 20. In this example, the conductive material 28 comprises copper, however, other similar materials may alternatively be used, such as aluminum, tungsten, etc. In this instance, the conductive material 28 is deposited using commonly used plating techniques since the conductive material 28 is copper. In the alternative, the conductive material 28 may be deposited using sputter and reflow techniques when using aluminum, or chemical vapor deposition (CVD) when using tungsten, and so on depending upon the material selected.

Figure 4:
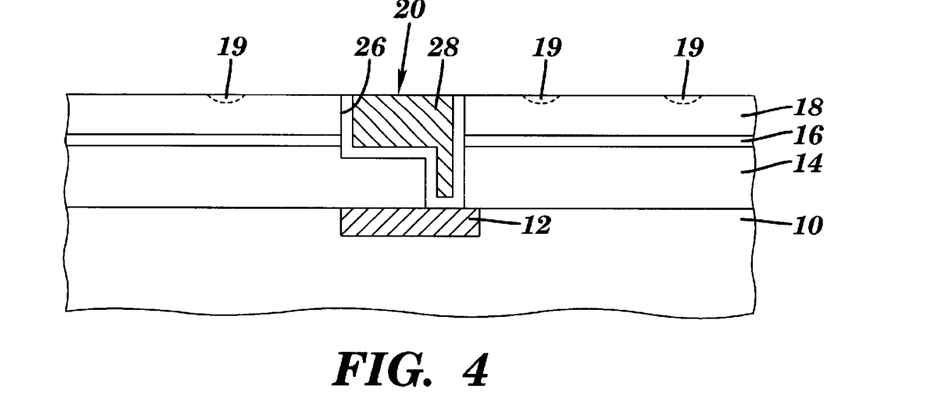
FIG. 4 depicts the semiconductor of FIG. 3 following planarization in accordance with a first embodiment of the present invention.

The substrate 10 is then planarized to remove the excess conductive material 28 and the liner 26 on the upper surface 32 of the substrate 10 surrounding the interconnection feature 20, leaving the liner 26 and conductive material 28 within the interconnection feature 20, as shown in FIG. 4. The conductive material 28 and the liner 26 on the upper surface 32 of the substrate 10 are planarized using a conventional chemical mechanical polishing (CMP) technique. In the alternative, other planarization techniques may also be used, such as plasma etching, wet etching, etc. The CMP processes used to remove the conductive material 28 and the liner 26 can result in numerous unwanted imperfections or defects 19 (shown in phantom) in the surface of the exposed layer, in this case the sacrificial layer 18. The formation of defects 19 is primarily attributable to the abrasive nature of the planarization process which tends to leave scratches and/or gouges in the surface of the substrate 10, (conventionally, the dielectric layer, described infra).

Figure 5:
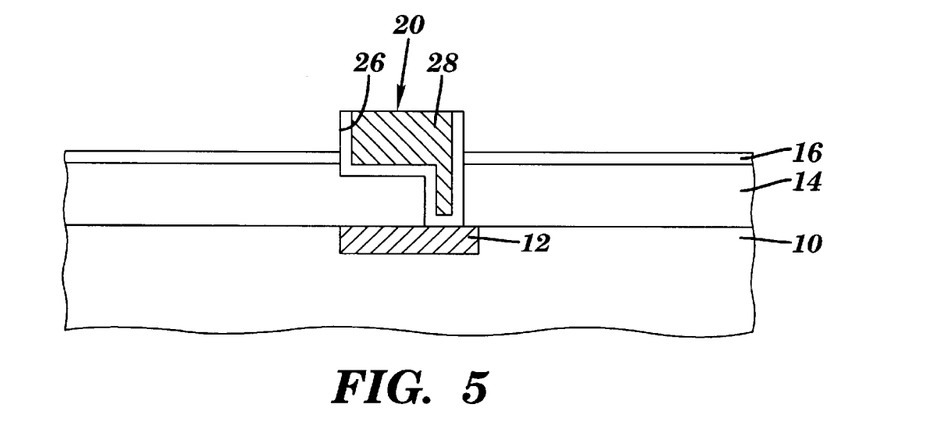
FIG. 5 depicts the semiconductor substrate of FIG. 4 following removal of a sacrificial layer in accordance with a first embodiment of the present invention.

As illustrated in FIG. 5, the sacrificial layer 18 containing the defects 19 caused by the planarization step, is removed using a selective wet etch. In the alternative, a plasma etch, or reactive ion etch (RIE) may also be used to remove the sacrificial layer 18. The selective etch removes the sacrificial layer 18, leaving the etch stop layer 16, the conductive material 28 within the interconnection feature 20, and the liner 26 surrounding the interconnection feature 20. This effectively eliminates the defects 19 formed in the sacrificial layer 18 as a result of the planarization step, thereby preventing the replication of the defects 19 in subsequent wiring levels (described infra).

Figure 6:
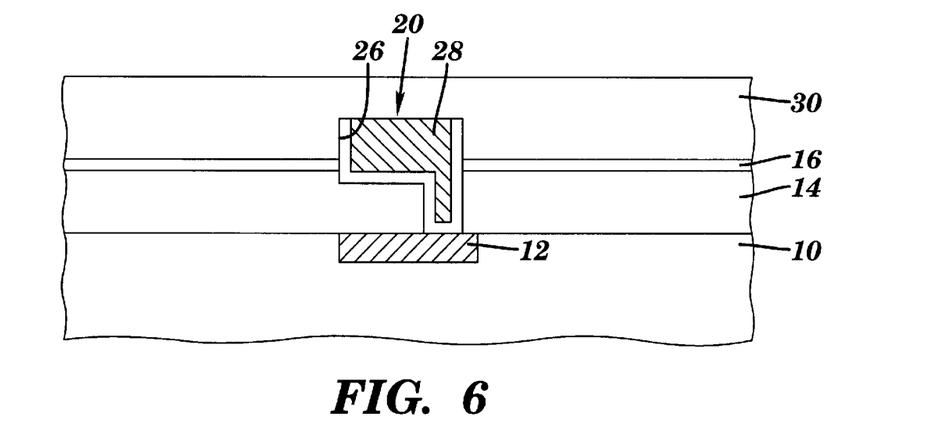
FIG. 6 depicts the semiconductor substrate of FIG. 5 having an insulative layer thereon in accordance with a first embodiment of the present invention.

As shown in FIG. 6, an insulative or dielectric layer 30 is then formed on the surface of the substrate 10. The dielectric layer 30 comprises oxides or various low k materials, such as fluorosilciate glass (FSG) and SiCOH, deposited using CVD or PECVD, and various polymers, such as polyarelene ethers (PAE) or aerogels, deposited by spin on techniques. Other similar materials and/or deposition techniques may also be used. The dielectric layer 30 has a thickness in the range of approximately 1000–5000 Å.

Figure 7:
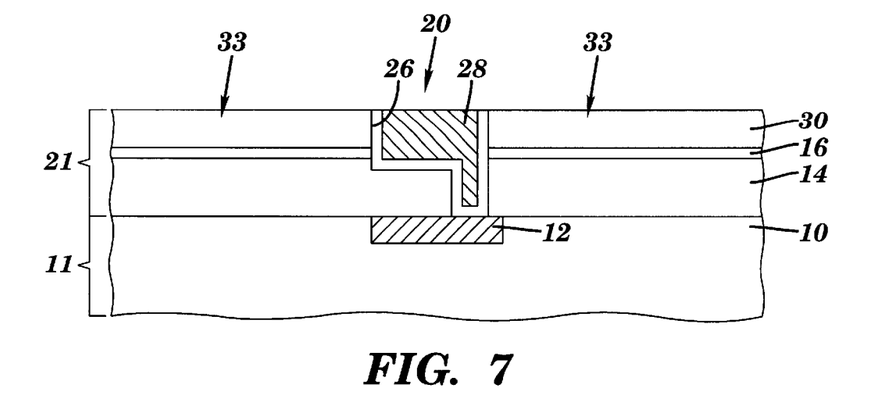
FIG. 7 depicts the semiconductor substrate of FIG. 6 following polishing in accordance with a first embodiment of the present invention.

As illustrated in FIG. 7, the surface of the substrate 10 is then polished, using CMP techniques commonly found in the available art, to expose the interconnection feature 20 by removing the excess dielectric layer 30 extending above the interconnection feature 20 to form a second wiring level 21. Because the dielectric layer 30 requires a less aggressive polish than that required to planarize the conductive material 28 (described above), the surface of the substrate has a reduced number of defects within the exposed surface 33, and is therefore ready for further processing.

Figure 8:
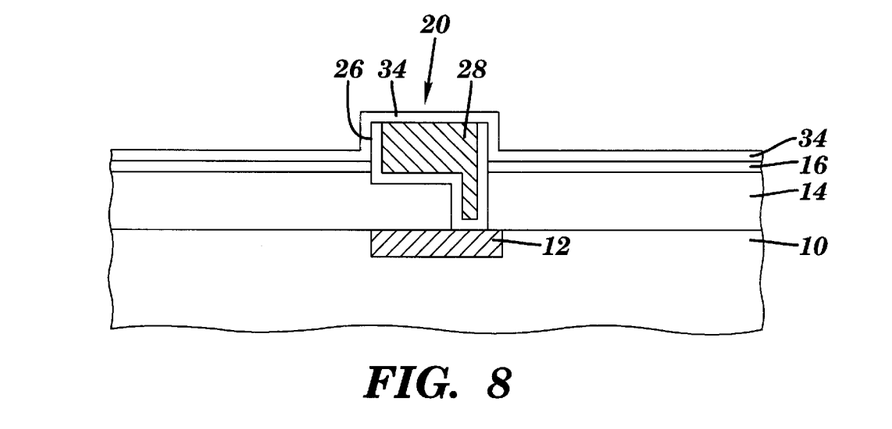
FIG. 8 depicts the semiconductor substrate of FIG. 5 having a capping layer over the interconnection feature in accordance with a second embodiment of the present invention.

In a second embodiment, following the formation of the structure shown in FIG. 5, a capping layer 34 is deposited over the interconnection feature 20 (FIG. 8). In this example, the capping layer 34 comprises silicon nitride, similar to the etch stop layer 16. Alternatively, the capping layer 34 may comprise other materials that function as a copper diffusion barrier, such as SiC. The capping layer 34 is deposited using a PECVD process, or any other process conventionally used to deposit a conformal diffusion barrier film or layer. The capping layer 34 is deposited at a thickness in the range of about 100–1000 Å.

Figure 9:
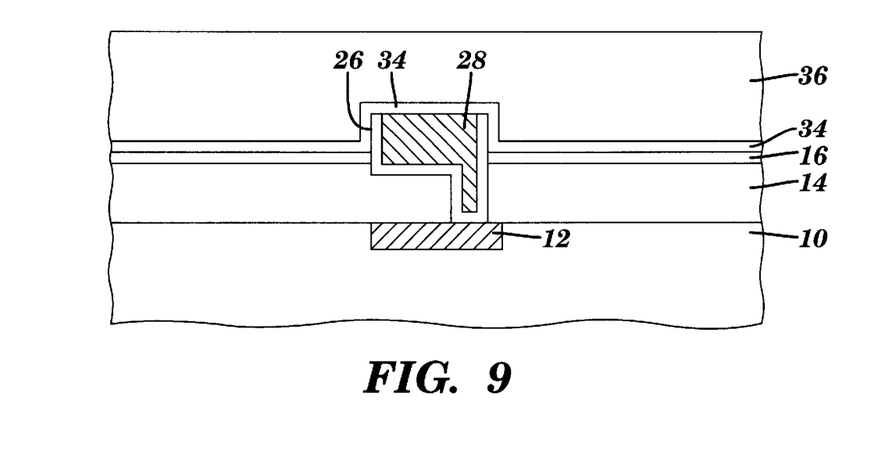
FIG. 9 depicts the semiconductor substrate of FIG. 8 having a dielectric layer thereon in accordance with a second embodiment of the present invention.

Following the deposition of the capping layer 34, a second ILD layer 36 is deposited over the surface of the substrate 10, as shown in FIG. 9. The second ILD layer 36 provides an insulative layer between the second wiring level 21 and the third wiring level being formed. The second ILD layer 36 comprises oxides or various low k materials, such as fluorosilciate glass (FSG) and SiCOH, deposited using CVD or PECVD, and various polymers, such as polyarelene ethers (PAE) or aerogels, deposited by spin on techniques. Other similar materials and/or deposition techniques may also be used. The thickness of the second ILD layer 36 ranges between approximately 5000 Å–2 microns.

Figure 10:
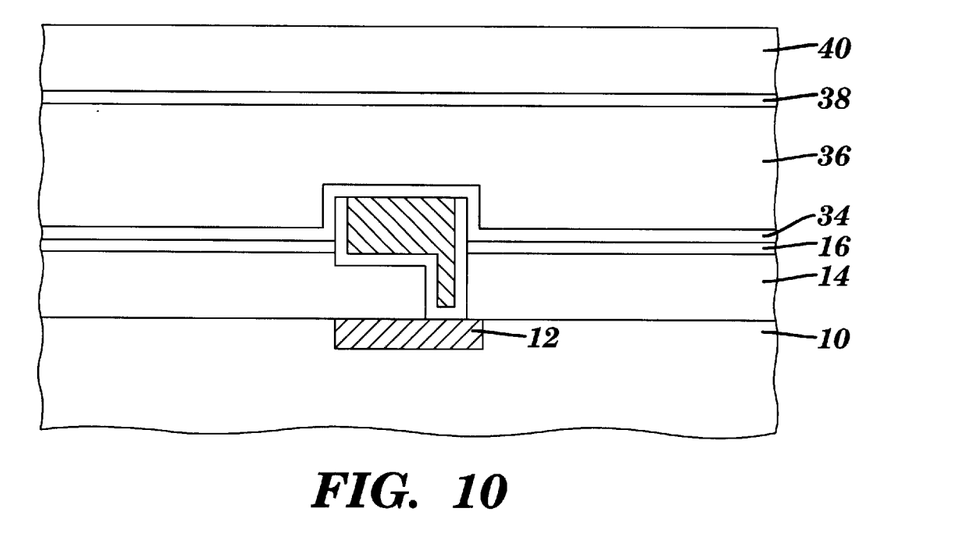
FIG. 10 depicts the semiconductor substrate of FIG. 9 having an etch stop and a sacrificial layer thereon in accordance with a second embodiment of the present invention.

As shown in FIG. 10, a second etch stop layer 38 is deposited over the second ILD layer 36. The second etch stop layer 38 comprises similar materials, and is deposited using similar processes, as those described in connection with the etch stop layer 14 of the first embodiment. A second sacrificial layer 40 is deposited over the second etch stop layer 38. The second sacrificial layer 40 comprises similar materials and is deposited using similar methods as those described with the sacrificial layer 18 of the first embodiment.

Figure 11:
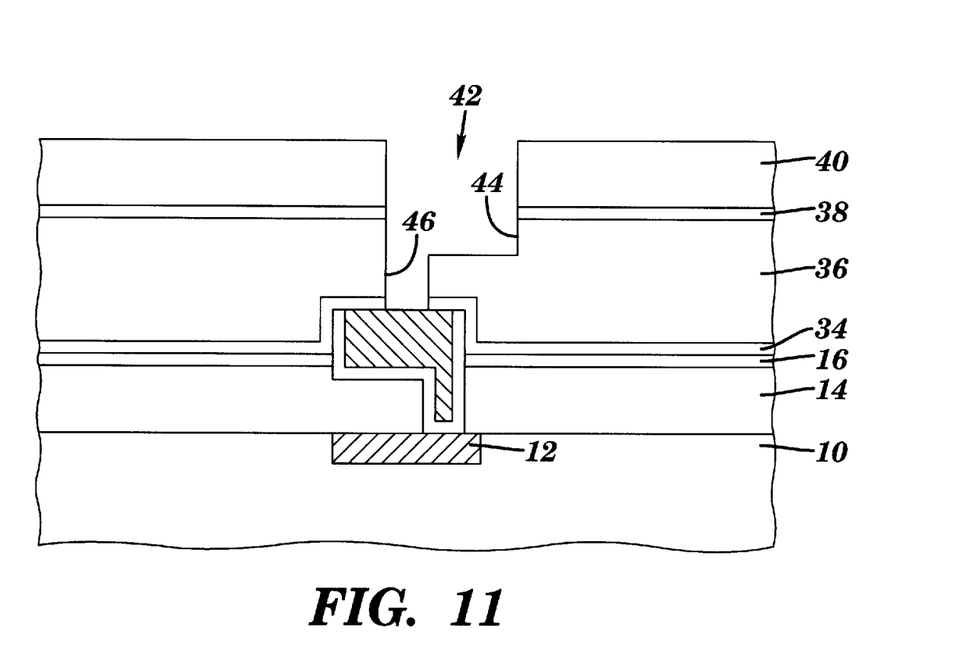
FIG. 11 depicts the semiconductor substrate of FIG. 10 having a interconnection feature formed therein in accordance with a second embodiment of the present invention.

A second interconnection feature 42 is then formed within the second ILD layer 36, the second etch stop layer 38 and the second sacrificial layer 40. As with the first interconnection feature 20, in this example the second interconnection feature 42 is a dual damascene interconnection feature, constructed of a trench 44 and a via 46. The second interconnection feature 42 is formed using techniques similar to those used and described in the first embodiment to form the first interconnection features 20.

Figure 12:
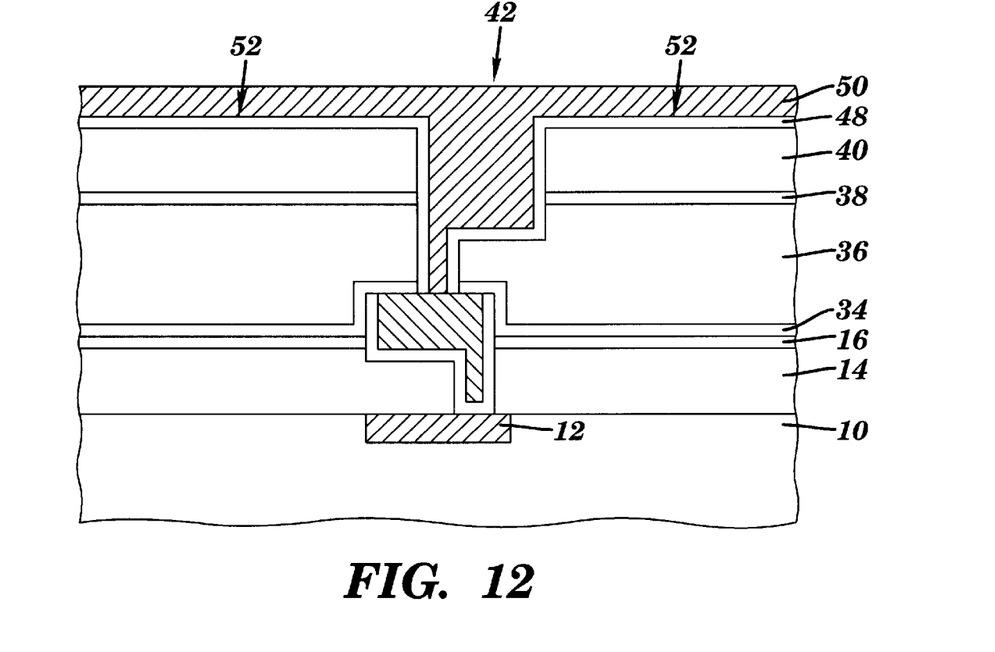
FIG. 12 depicts the semiconductor substrate of FIG. 11 having a conductive material thereon in accordance with a second embodiment of the present invention.

As shown in FIG. 12, a second liner 48 is deposited over the surface of the substrate 10, coating the surface of the second sacrificial layer 40, as well as the second interconnection feature 42. The second liner 48 comprises similar materials and is deposited using similar methods as those described above in association with the first liner 16. Following the deposition of the second liner 48, a conductive material 50 is deposited over the surface of the substrate 10, filling the second interconnection feature 42. The conductive material 50 comprises a similar material and is deposited using similar techniques as those described in the first embodiment in conjunction with the first conductive material 28.

Figure 13:
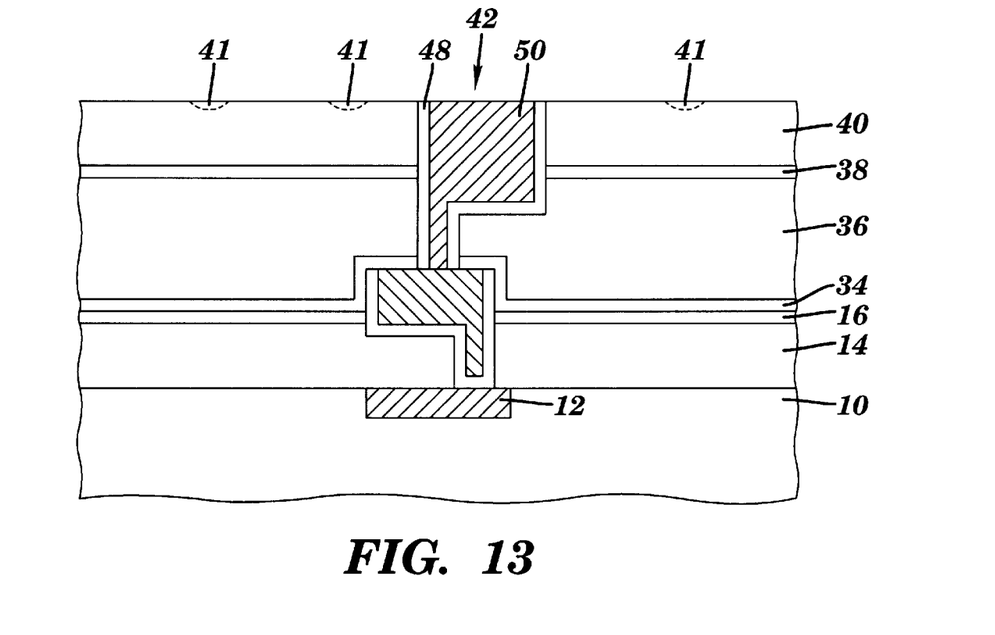
FIG. 13 depicts the semiconductor substrate of FIG. 12 following planarization in accordance with a second embodiment of the present invention.
Figure 14:
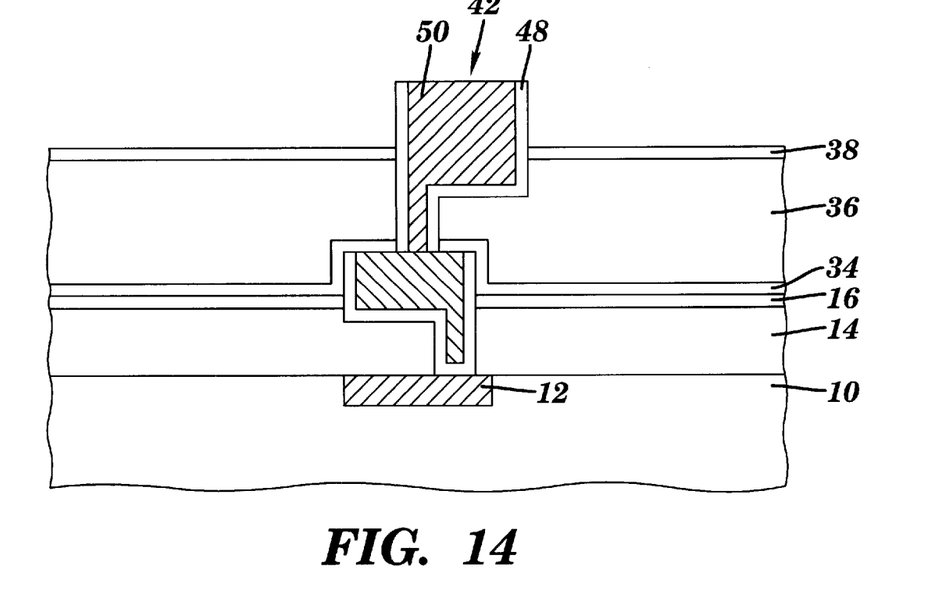
FIG. 14 depicts the semiconductor substrate of FIG. 13 following removal of a sacrificial layer in accordance with a second embodiment of the present invention.

As with the first embodiment, the conductive material 50 is planarized using similar techniques as described supra. Planarization removes the second liner 48 on the top surface 52 of the substrate 10, surrounding the second interconnection feature 42, as well as the excess conductive material 50 extending above the second interconnection feature 42 (FIG. 13). The planarization step, as described in the first embodiment, tends to produce defects 41 (shown in phantom) in the surface of the substrate 10. As shown in FIG. 14, the second sacrificial layer 40 containing the defects 41 is then removed, stopping at the second etch stop layer 38, as described above. During the removal of the second sacrificial layer 40 the second interconnection feature 42 and the second liner 48 surrounding the second interconnection feature 42 remain intact.

Figure 15:
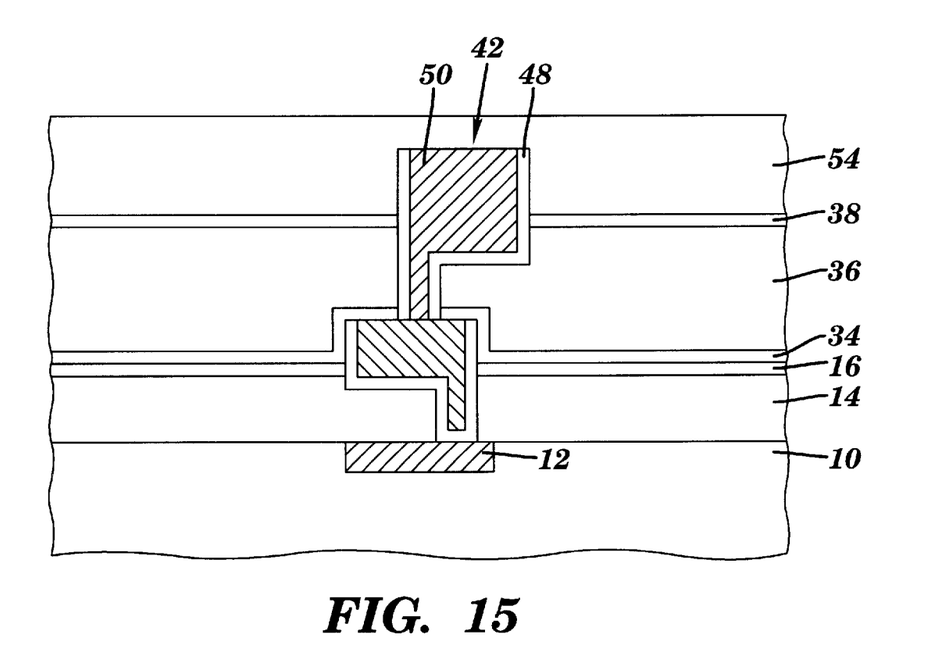
FIG. 15 depicts the semiconductor substrate of FIG. 14 having an insulative layer thereon in accordance with a second embodiment of the present invention.
Figure 16:
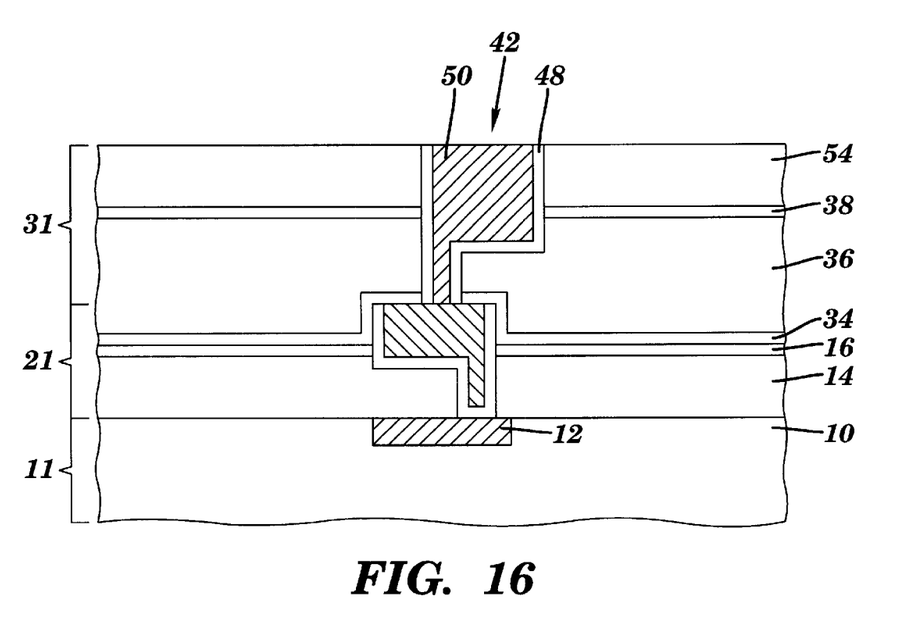
FIG. 16 depicts the semiconductor substrate of FIG. 15 following polishing in accordance with a second embodiment of the present invention.

As shown in FIG. 15, a second insulative or dielectric layer 54 is deposited over the exposed upper surface of the substrate 10 using techniques similar to those associated with the first dielectric layer 30, described above. Likewise, the second dielectric layer 54 comprises similar materials as the first dielectric layer 30. The second dielectric layer 54 is then polished back to the upper surface of the second interconnection feature 42, as shown in FIG. 16, using similar techniques as those employed while polishing back the first dielectric layer 30, described above, thereby forming a third wiring level 31.

Additional wiring levels (not shown) containing interconnection features may then be added atop the third wiring level 31, in a similar manner as described above. In particular, following the removal of the second sacrificial layer 40 (illustrated in FIG. 14), a second capping layer, similar to the capping layer 34 (see FIG. 8) may be deposited over the surface of the substrate 10 and the second interconnection feature 42. Thereafter, the process described above, and illustrated in FIGS. 8–16 may be repeated to form each subsequent wiring level having interconnection features therein.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of forming a semiconductor device, comprising:
   (a) providing a substrate;
   (b) depositing a first insulative layer over a surface of the substrate;
   (c) forming at least one interconnection feature in the first insulative layer;
   (d) depositing a first conductive material over the surface of the substrate filling the interconnection feature and contacting the substrate;
   (e) planarizing the substrate to remove the first conductive material except from within the interconnection feature;
   (f) removing at least a portion of the first insulative layer forming a plurality of exposed surfaces;
   (g) depositing a second insulative layer in contact with said exposed surfaces; and
   (h) coplanarizing the surface of the second insulative layer and the conductive material within the interconnection feature, such that the second insulative layer is substantially similar to the first insulative layer prior to removal of the first insulative layer.

2. The method of claim 1, further comprising:
   depositing a capping layer over the substrate following the removal of the first insulative layer;
   depositing a third insulative layer over the substrate;
   forming at least one second interconnection feature in the third insulative layer;
   depositing a second conductive material over the surface of the substrate, filling the second interconnection feature and contacting the first conductive material within the first interconnection feature;
   planarizing the substrate to remove the second conductive material, except from within the second interconnection feature;
   removing a portion of the second insulative layer; and
   depositing a fourth insulative layer over the substrate.

3. The method of claim 2, wherein the capping layer comprises a diffusion barrier material.

4. The method of claim 2, wherein the capping layer comprises silicon nitride.

5. The method of claim 2, wherein the at least one first and second interconnection features formed within each additional layer are electrically interconnected.

6. The method of claim 1, wherein providing a substrate further comprises:
   depositing an insulative material over the surface of the substrate; and
   depositing an etch stop layer over the insulative material prior to step (b).

7. The method of claim 6, wherein the insulative material comprises an inter-level dielectric material.

8. The method of claim 6, wherein the insulative material comprises oxides or low k materials, and polymers.

9. The method of claim 6, wherein the etch stop layer comprises silicon nitride.

10. The method of claim 1, wherein the first insulative layer comprises oxides or low k materials, and polymers.

11. The method of claim 1, wherein at least one of the first and second interconnection features comprises a dual damascene feature.

12. The method of claim 1, wherein at least one of the first and second interconnection features comprise wire.

13. The method of claim 1, wherein at least one of the first and second interconnection features comprise a via.

14. The method of claim 1, wherein the conductive material comprises at least one of the following: copper, aluminum, tungsten.

15. The method of claim 1, wherein the second insulative layer is polished to planarize the substrate.

16. The method of claim 1, further comprising:
   depositing a liner within the at least one first interconnection feature prior to depositing the first conductive material.

17. The method of claim 16, wherein the liner comprises a diffusion barrier material.

18. The method of claim 17, wherein the diffusion barrier material consists of a material selected from the group consisting of: tantalum, tantalum nitride, tungsten, tungsten nitride, titanium and titanium nitride.

19. A method of forming a semiconductor device, comprising:
   providing a substrate having a first insulative layer formed on the substrate;
   forming at least one first interconnection feature within the substrate and the first insulative layer;
   depositing a first liner within the at least one first interconnection feature;
   depositing a first conductive material within the at least one first interconnection feature;
   removing the first insulative layer forming a plurality of exposed surfaces;
   depositing a second insulative layer in contact with said exposed surfaces following the removal of the first insulative layer; and
   planarizing the surface of the substrate to expose the first interconnection feature, such that the second insulative layer is substantially similar to the first insulative layer prior to removal of the first insulative layer.

20. The method of claim 19, wherein providing the substrate further comprises:
   depositing an insulative material over a surface of the substrate; and
   depositing a first etch stop layer over the insulative material.

21. The method of claim 19, further comprising:
   depositing a capping layer over the first interconnection feature following the removal of the first insulative layer;
   depositing a third insulative layer over the capping layer;
   depositing an etch stop layer over the third insulative layer;
   depositing a fourth insulative layer over the etch stop layer;
   forming an at least one second interconnection feature within the fourth insulative layer, the etch stop layer and the third insulative layer;
   planarizing the substrate;
   removing the fourth insulative layer;
   depositing a fifth insulative layer over the surface of the substrate; and
   planarizing the surface of the substrate to expose the at least one second interconnection feature.

22. A method of reducing the formation of defects during semiconductor manufacture, comprising:
   (a) providing a substrate;
   (b) depositing a first insulative layer on the substrate;
   (c) forming at least one interconnection feature within the first insulative layer;
   (d) depositing a conductive material over a surface of the substrate;
   (e) planarizing the surface of the substrate;
   (f) removing the first insulative layer having defects produced therein from the planarizing thereby exposing a plurality of surfaces;
   (g) depositing a second insulative layer in contact with said exposed surfaces following planarization; and
   (h) planarizing the second insulative layer to expose the interconnection feature, such that the second insulative layer is substantially similar to the first insulative layer prior to removal of the first insulative layer.

23. The method of claim 22, further comprising:
   (i) depositing a capping layer over the interconnection feature following the removal of the first insulative layer.

24. The method of claim 23, further comprising:
   repeating (b)–(i) for each level of interconnection features.

* * * * *